United States Patent
Lee et al.

(12)

(10) Patent No.: US 11,282,833 B2
(45) Date of Patent: Mar. 22, 2022

(54) SEMICONDUCTOR DEVICE

(71) Applicant: Samsung Electronics Co., Ltd., Suwon-si (KR)

(72) Inventors: Dong Jin Lee, Seoul (KR); Ji Young Kim, Yongin-si (KR); Bong Soo Kim, Yongin-si (KR); Hyeon Kyun Noh, Hwaseong-si (KR); Moon Young Jeong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 12 days.

(21) Appl. No.: 16/660,976

(22) Filed: Oct. 23, 2019

(65) Prior Publication Data
US 2020/0161294 A1    May 21, 2020

(30) Foreign Application Priority Data
Nov. 16, 2018   (KR) .......................... 10-2018-0141232

(51) Int. Cl.
| H01L 27/06 | (2006.01) |
| H01L 27/108 | (2006.01) |
| H01L 27/12 | (2006.01) |
| H01L 29/22 | (2006.01) |

(52) U.S. Cl.
CPC .... H01L 27/0629 (2013.01); H01L 27/10805 (2013.01); H01L 27/124 (2013.01); H01L 27/1225 (2013.01); H01L 29/22 (2013.01)

(58) Field of Classification Search
CPC ........... H01L 27/0629; H01L 27/10805; H01L 27/1225; H01L 27/124
See application file for complete search history.

(56) References Cited

U.S. PATENT DOCUMENTS

| 8,946,812 | B2 | 2/2015 | Ishizuka et al. |
| 8,969,154 | B2 | 3/2015 | Sandhu |
| 9,368,609 | B2 | 6/2016 | Okamoto et al. |
| 9,735,239 | B2 | 8/2017 | Doombos et al. |
| 9,741,800 | B2 | 8/2017 | Lin et al. |
| 9,768,305 | B2 | 9/2017 | Ko et al. |
| 9,818,855 | B2 | 11/2017 | Saito et al. |
| 9,837,497 | B1 | 12/2017 | He et al. |
| 2008/0296670 | A1* | 12/2008 | Lee .......................... H01L 29/78 257/330 |
| 2014/0327056 | A1* | 11/2014 | Park .................. H01L 21/28044 257/288 |
| 2016/0329434 | A1 | 11/2016 | Ito et al. |
| 2016/0351711 | A1 | 12/2016 | Bae et al. |
| 2018/0158958 | A1 | 6/2018 | Mohapatra et al. |

(Continued)

FOREIGN PATENT DOCUMENTS

JP      2006-245243 A    9/2006

*Primary Examiner* — Christine A Enad
(74) *Attorney, Agent, or Firm* — Harness, Dickey & Pierce, P.L.C.

(57) ABSTRACT

A semiconductor device is provided. The semiconductor device includes a first substrate, an active region defined by an isolation film in the first substrate, an oxide semiconductor layer on the first substrate in the active region, and not comprising silicon, a recess inside the oxide semiconductor layer, and a gate structure filling the recess, comprising a gate electrode and a capping film on the gate electrode, and having an upper surface on a same plane as an upper surface of the active region.

20 Claims, 16 Drawing Sheets

(56) References Cited

U.S. PATENT DOCUMENTS

| | | |
|---|---|---|
| 2018/0166382 A1 | 6/2018 | Lee |
| 2018/0286987 A1* | 10/2018 | Lee .................. H01L 29/045 |
| 2020/0176580 A1* | 6/2020 | Siemieniec ......... H01L 29/1095 |
| 2020/0335622 A1* | 10/2020 | Hiyoshi ............... H01L 21/822 |

* cited by examiner

SEMICONDUCTOR DEVICE

This application claims priority to Korean Patent Application No. 10-2018-0141232, filed on Nov. 16, 2018, and all the benefits accruing therefrom under 35 U.S.C. § 119, the disclosure of which is incorporated herein by reference in its entirety.

BACKGROUND

1. Technical Field

The present disclosure relates to a semiconductor device.

2. Description of the Related Art

With continuously enhanced integration of a semiconductor device, separate circuit patterns become further miniaturized to implement more semiconductor devices on the same dimensional area. That is, the increased integration density of the semiconductor device causes reduced design rules with respect to constituent elements of the semiconductor device.

Researches for enhancing leakage characteristics in a buried word line array transistor (BCAT) structure in which a plurality of word lines are buried are ongoing.

SUMMARY

An aspect of the present disclosure is to provide a semiconductor device which can improve reliability by enhancing leakage characteristics by forming an oxide semiconductor layer including a material having a higher bandgap on a channel region of an active region (ACT).

According to some example embodiments of the present disclosure, there is provided a semiconductor device, comprising a first substrate, an active region defined by an isolation film in the first substrate, an oxide semiconductor layer on the first substrate in the active region, and not comprising silicon, the oxide semiconductor layer including a recess, and a gate structure filling the recess, comprising a gate electrode and a capping film on the gate electrode, the gate structure having an upper surface on a same plane as an upper surface of the active region.

According to some example embodiments of the present disclosure, there is provided a semiconductor device, comprising a substrate, an active region defined by an isolation film in the substrate, a gate structure in the isolation film and the active region, and having an upper surface on a same plane as an upper surface of the active region, an oxide semiconductor layer in the active region, contacting at least a part of a sidewall of the gate structure, and not comprising silicon, and a capacitor electrically connected with the active region and extended in a thickness direction of the substrate.

According to some example embodiments of the present disclosure, there is provided a semiconductor device, comprising a substrate, an active region defined by an isolation film in the substrate, and extended in a first direction, an oxide semiconductor layer on the substrate in the active region, extended in the first direction, and not comprising silicon, a word line extended in a second direction which is different from the first direction in the isolation film and the active region, and a bit line extended in a third direction which is different from the first and second directions on the isolation film and the active region, wherein an upper surface of the oxide semiconductor layer is on a same plane as an upper surface of the active region.

The aspects that are intended to be addressed by the present disclosure are not limited to those mentioned above, and other aspects that are not mentioned above may be clearly understood to those skilled in the art based on the description provided below.

BRIEF DESCRIPTION OF THE DRAWINGS

The above and other aspects, features and advantages of the present disclosure will become more apparent to those of ordinary skill in the art by describing in detail example embodiments thereof with reference to the accompanying drawings, in which.

DETAILED DESCRIPTION

Hereinbelow, a semiconductor device according to some example embodiments of the present disclosure will be described with reference to FIG. 1 and FIG. 2.

Figure 1:
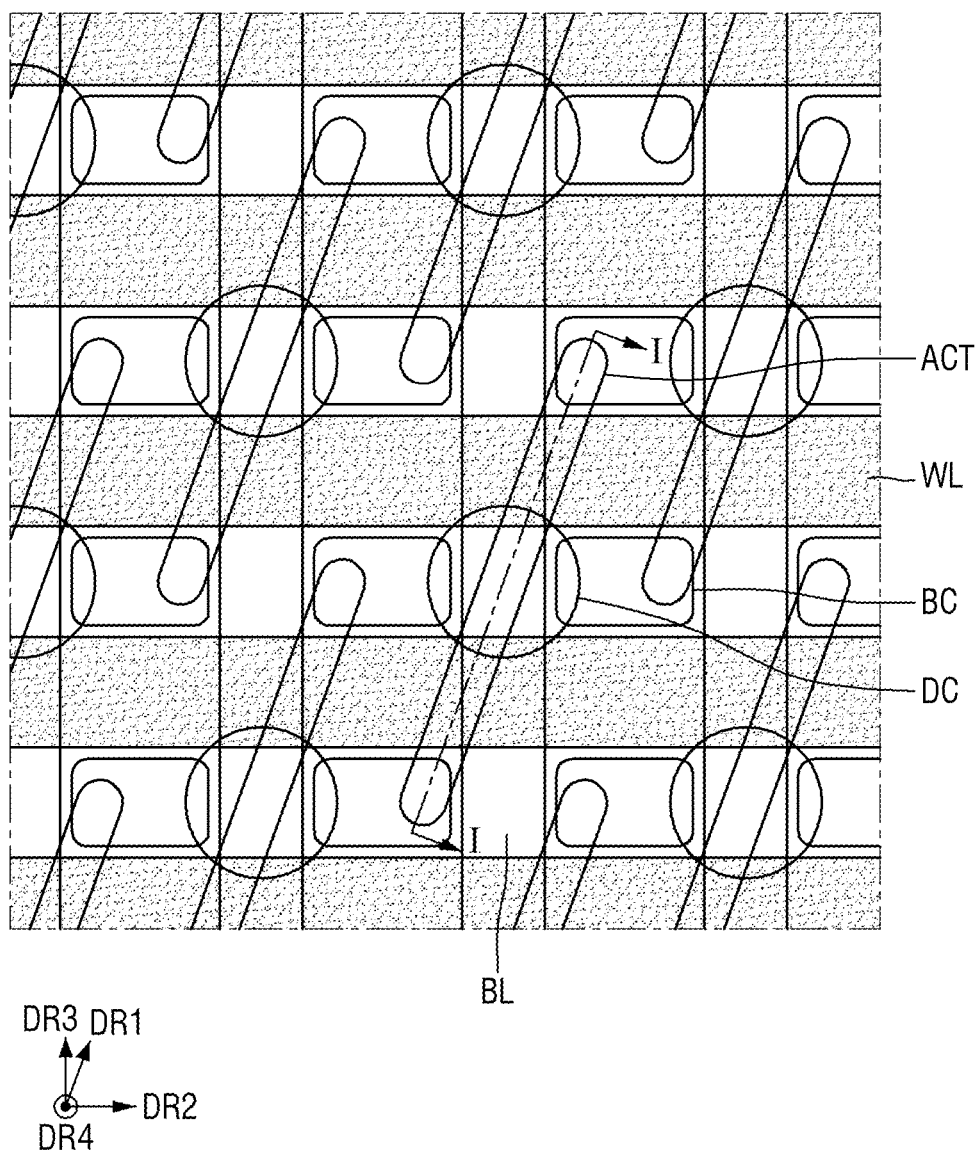
FIG. 1 is a schematic layout diagram of a semiconductor device according to some example embodiments of the present disclosure.

FIG. 1 is a schematic layout diagram of a semiconductor device according to some example embodiments. FIG. 2 is a cross-sectional view taken on line I-I of FIG. 1.

Although a dynamic random access memory (DRAM) is exemplified in the drawings of a semiconductor device according to some example embodiments, the present disclosure is not limited thereto.

Referring to FIG. 1, the semiconductor device according to some example embodiments may include a plurality of active regions ACT. The active region ACT may be defined by an isolation film 105 (FIG. 2) which is arranged in a substrate 100 (FIG. 2) and an oxide semiconductor layer 102.

With decreased design rule of the semiconductor device, the active region ACT may be arranged in a bar-like form of a diagonal line or oblique line, as illustrated in FIG. 1. The active region ACT may be arranged to extend in a first direction DR1.

On the active regions ACT and across the active regions ACT, a plurality of gate electrodes may be arranged in a second direction DR2. The plurality of gate electrodes may be extended in parallel with one another. The plurality of gate electrodes may be, for example, a plurality of word lines WL.

The word lines WL may be arranged by a uniform pitch. A width of the word line WL or a pitch between the word lines WL may be determined according to the design rule.

On the word lines WL and orthogonally to the word lines WL, a plurality of bit lines BL extended in a third direction DR3 may be arranged. The plurality of bit lines BL may be extended in parallel with one another.

The bit lines BL may be arranged by a uniform pitch. A width of the bit line BL or a pitch between the bit lines BL may be determined according to the design rule.

In some example embodiments, the bit lines BL may be arranged in parallel with one another having a pitch of 3F. Further, the word lines WL may be arranged in parallel with one another having a pitch of 2F.

As used herein, 'F' may indicate a 'minimum lithographic feature size'. When the bit lines BL and the word lines WL are arranged by the pitch described above, the semiconductor device may include a memory cell having a unit cell size of $6F^2$.

The semiconductor device according to some example embodiments may include various contact arrangements formed on the active regions ACT. Various contact arrangements may include, for example, direct contacts DC and buried contacts BC.

Herein, the direct contact DC may indicate a contact for electrically connecting the active region ACT to the bit line BL. The buried contact BC may indicate a contact for connecting the active region ACT to a lower electrode 191 (FIG. 2) of a capacitor.

In the semiconductor device according to some example embodiments, the direct contact DC may be arranged on a center of the active region ACT. The buried contacts BC may be arranged on both ends of the active region ACT.

In other words, the buried contact BC may be arranged to overlap the active region ACT and the isolation film 105 (FIG. 2) between the adjacent word lines WL and between the adjacent bit lines BL.

The word lines WL may be formed in a structure buried in the active regions ACT. The word lines WL may be arranged across the active regions ACT between the direct contacts DC or the buried contacts BC.

As illustrated in FIG. 1, the two word lines WL may be arranged across the one active region ACT. As the active region ACT is arranged in a diagonal line, the word line WL may have an angle of less than 90 degrees with the active region ACT. The direct contacts DC and the buried contacts BC may be arranged symmetrically on the active regions ACT.

Figure 2:
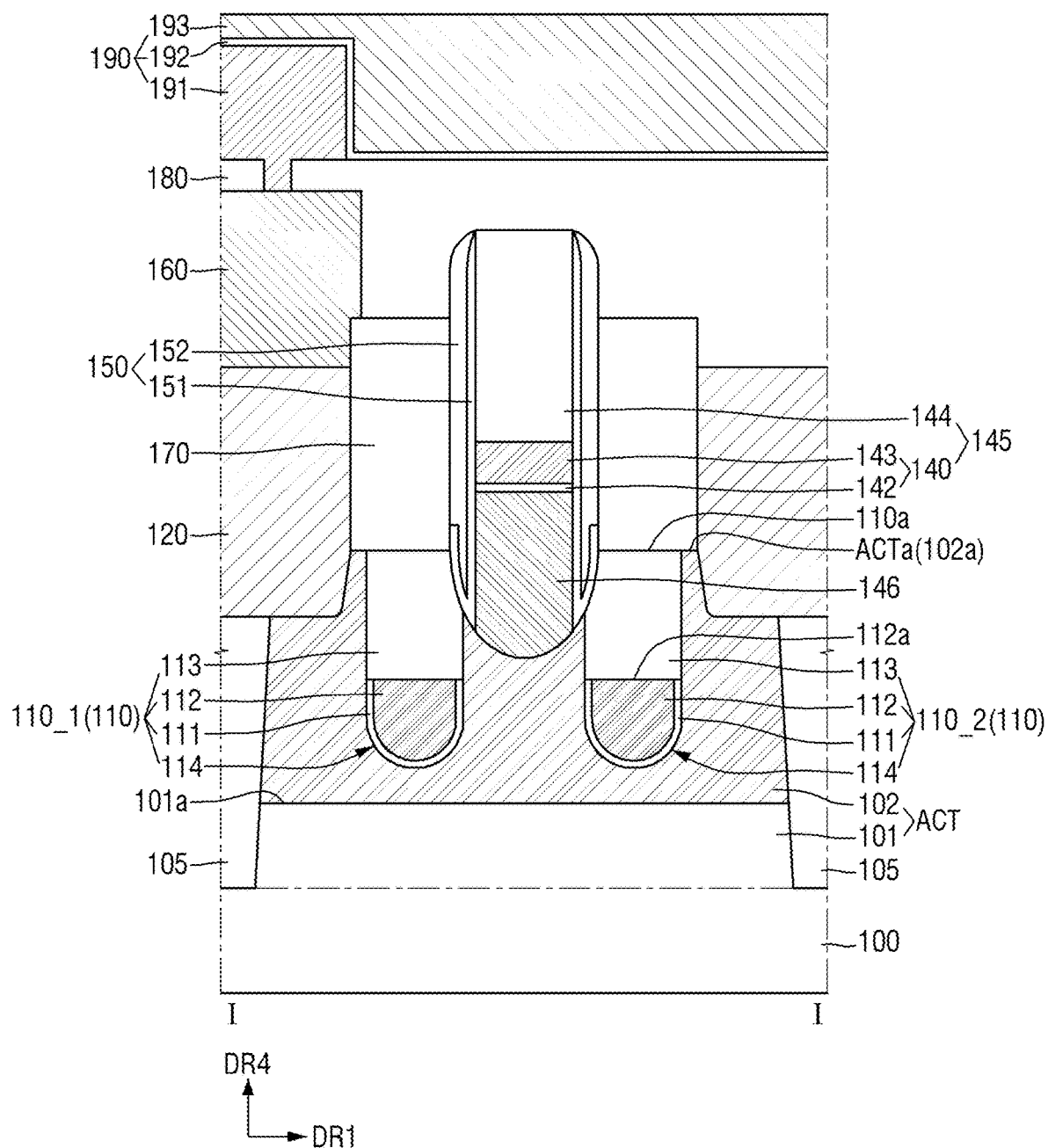
FIG. 2 is a cross-sectional view taken on line I-I of FIG. 1.

Referring to FIG. 1 and FIG. 2, the semiconductor device according to some example embodiments may include the substrate 100, the active region ACT, the isolation film 105, a plurality of gate structures 110, a storage contact 120, a plurality of wire conductive films 140, a bit line contact 146, and/or a capacitor 190.

The substrate 100 may be bulk silicon or a silicon-on-insulator (SOI). Alternatively, the substrate 100 may be a silicon substrate, or may include other materials such as silicon germanium, silicon germanium on insulator (SGOI), indium antimonide, a lead telluride compound, indium arsenide, indium phosphide, gallium arsenide, or gallium antimonide, but the present disclosure is not limited thereto. In the following description, it is assumed that the substrate 100 is a silicon substrate.

The isolation film 105 may be formed in the substrate 100 and the oxide semiconductor layer 102. Although FIG. 2 depicts that the isolation film 105 is formed in a first substrate 101 arranged on the substrate 100, this is only for convenience of explanation. That is, the substrate 100 and the first substrate 101 include the same material, and a portion of the substrate 100 included in the active region ACT is illustrated as the first substrate 101 for convenience of explanation.

The isolation film 105 may have a shallow trench isolation structure having device isolation characteristics. The isolation film 105 may define the active region ACT in the first substrate 101 and the oxide semiconductor layer 102.

The isolation film 105 may include at least one of, for example, a silicon oxide film, a silicon nitride film, and a silicon oxynitride film, but the present disclosure is not limited thereto. In the semiconductor device according to some example embodiments, it is described that the isolation film 105 includes the silicon oxide film.

Although FIG. 2 depicts that the isolation film 105 is formed as one insulation film, this is only for convenience of explanation, and the present disclosure is not limited thereto.

The active region ACT may have a long island form including a short axis and a long axis, as illustrated in FIG. 1. The active region ACT may have a diagonal line form having an angle of less than 90 degrees with respect to the word line WL formed in the isolation film 105. Further, the active region ACT may have a diagonal line form having an angle of less than 90 degrees with respect to the bit line BL formed on the isolation film 105. That is, the active region ACT may be extended in the first direction DR1 that has a certain angle with respect to the second direction DR2 and the third direction DR3.

The active regions ACT may be arranged on the substrate 100. The active region ACT may include the first substrate 101 protruding from the substrate 100 in a fourth direction DR4, and the oxide semiconductor layer 102 arranged on the first substrate 101. The active region ACT may be isolated from an adjacent active region ACT by the isolation film 105.

The oxide semiconductor layer 102 may include a material that does not include silicon and/or has a higher bandgap. The oxide semiconductor layer 102 may include, for example, indium gallium zinc oxide (IGZO). However, the present disclosure is not limited thereto. That is, in some other example embodiments, the oxide semiconductor layer 102 may include another material that does not include silicon and/or has a higher bandgap.

The oxide semiconductor layer 102 may be arranged on the uppermost portion of the active region ACT. That is, an upper surface 102a of the oxide semiconductor layer 102 may be formed on the same plane as an upper surface ACTa of the active region ACT. However, the present disclosure is not limited thereto.

The gate structure 110 may be arranged in the oxide semiconductor layer 102 and the isolation film 105. The gate structure 110 may be arranged across the isolation film 105 and the active region ACT defined by the isolation film 105. The gate structure 110 may be formed in the oxide semiconductor layer 102 and the isolation film 105 which are positioned in the second direction DR2 in which the gate structure 110 is extended.

The two gate structures 110 may be arranged on one active region ACT across the active region ACT. The two gate structures 110 may be spaced apart from each other in the third direction DR3. This is illustrated in FIG. 2 as a first gate structure 110_1 and a second gate structure 110_2 being spaced apart from each other in the first direction DR1 in the active region ACT.

The gate structure 110 may include a recess 114, a gate insulation film 111, a gate electrode 112, and/or a capping film 113, which are formed in the oxide semiconductor layer 102 and the isolation film 105. Herein, the gate electrode 112 may correspond to the word line WL.

The gate structure 110 may be arranged inside the oxide semiconductor layer 102 in the active region ACT. That is, the recess 114 may be formed inside the oxide semiconductor layer 102 in the active region ACT, and a bottom surface of the recess 114 may be spaced apart from the first substrate 101. However, the present disclosure is not limited thereto.

The gate insulation film 111 may be extended along a sidewall and the bottom surface of the recess 114. The gate insulation film 111 may be arranged between an inner wall of the recess 114 and the gate electrode 112 along the inner wall of the recess 114.

The gate insulation film 111 may not be arranged between the inner wall of the recess 114 and the capping film 113. However, the present disclosure is not limited thereto.

The gate insulation film 111 may include silicon oxide, silicon nitride, silicon oxynitride or a high-k dielectric material with a higher dielectric constant than silicon oxide. For example, the high-k dielectric material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

While the high-k dielectric material described above is explained mainly with reference to oxide, alternatively, the high-k dielectric material may include one or more of the nitride (e.g., hafnium nitride) or the oxynitride (e.g., hafnium oxynitride) of the metallic materials (e.g., hafnium) described above, but the present disclosure is not limited thereto.

The gate electrode 112 may be arranged on the gate insulation film 111. The gate electrode 112 may fill a portion of the recess 114. An upper surface 112a of the gate electrode 112 may be formed on the same plane as an upper surface of the gate insulation film 111, but the present disclosure is not limited thereto.

The gate electrode 112 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

The gate electrode 112 may include conductive metal oxide, conductive metal oxynitride or the like, or an oxidized form of the metallic materials from the aforementioned materials.

The upper surface 112a of the gate electrode 112 may be formed to be closer to the upper surface 102a of the oxide semiconductor layer 102 than an upper surface 101a of the first substrate 101. That is, the upper surface 112a of the gate electrode 112 may be formed between the upper surface 101a of the first substrate 101 and the upper surface 102a of the oxide semiconductor layer 102.

The capping film 113 may be arranged on the gate electrode 112. The capping film 113 may fill the other portion of the inside of the recess 114 in which the gate insulation film 111 and the gate electrode 112 are arranged. The capping film 113 may include at least one of, for example, silicon nitride (SiN), silicon oxynitride (SiON), silicon oxide (SiO$_2$), silicon carbonitride (SiCN), silicon oxycarbonitride (SiOCN) and a combination thereof.

An upper surface of the capping film 113 in FIG. 2 may indicate an upper surface 110a of the gate structure 110. The upper surface of the capping film 113 may be formed on the same plane as the upper surface 102a of the oxide semiconductor layer 102. That is, the upper surface 110a of the gate structure 110 may be formed on the same plane as the upper surface 102a of the oxide semiconductor layer 102.

Although not illustrated in FIG. 2, an impurity doped region may be formed on at least one side of the gate structure 110. The impurity doped region may be a source/drain region of the transistor.

The wire conductive film 140 may be arranged on the oxide semiconductor layer 102 and the isolation film 105 in which the gate structure 110 is formed. The wire conductive film 140 may intersect with the isolation film 105 and the active region ACT defined by the isolation film 105.

That is, the one wire conductive film 140 may be arranged on the oxide semiconductor layer 102 and the isolation film 105 which are positioned in the third direction DR3 in which the wire conductive film 140 is extended. The wire conductive film 140 may be formed to intersect with the gate structure 110. Herein, the wire conductive film 140 may correspond to the bit line BL.

The wire conductive film 140 may be a single-layered film, but may be a multi-layered film as illustrated. When the wire conductive film 140 is a multi-layered film, the wire conductive film 140 may include, for example, a first conductive film 142 and a second conductive film 143, but the present disclosure is not limited thereto. The first and second conductive films 142, 143 may be sequentially stacked on the oxide semiconductor layer 102 and the isolation film 105.

The first and second conductive films 142, 143 may each include at least one of, for example, a semiconductor material doped with impurity, a conductive silicide compound, conductive metal nitride, and metal. For example, the first conductive film 142 may include a conductive silicide compound, and the second conductive film 143 may include at least one of conductive metal nitride and metal. However, the present disclosure is not limited thereto.

The bit line contact 146 may be arranged between the wire conductive film 140 and the oxide semiconductor layer 102. That is, the wire conductive film 140 may be arranged on the bit line contact 146.

For example, the bit line contact 146 may be arranged at an intersection between the wire conductive film 140 and a center of the active region ACT having a long island shape. The bit line contact 146 may be arranged between the oxide semiconductor layer 102 at the center of the active region ACT and the wire conductive film 140.

The bit line contact 146 may electrically connect the wire conductive film 140 and the oxide semiconductor layer 102. For example, the bit line contact 146 may electrically connect the impurity doped region of the oxide semiconductor layer 102 between the adjacent gate structures 110 to the wire conductive film 140. Herein, the bit line contact 146 may correspond to the direct contact DC.

A depth from the upper surface 110a of the gate structure 110 to a bottom surface of the bit line contact 146 may be less than a depth from the upper surface 110a of the gate structure 110 to a lower surface of the capping film 113. However, the present disclosure is not limited thereto.

The bit line contact 146 may include at least one of, for example, a semiconductor material doped with impurity, a conductive silicide compound, conductive metal nitride, and metal. However, the present disclosure is not limited thereto.

A wire capping film 144 may be arranged on the wire conductive film 140 and extended in the third direction DR3. The wire capping film 144 may include a silicon nitride film, for example, but the present disclosure is not limited thereto.

The wire conductive film 140 and the wire capping film 144 may be included in a bit line structure 145. A space between the adjacent bit line structures 145 may vertically overlap the oxide semiconductor layer 102 and the isolation film 105.

A wire spacer 150 may be arranged on a sidewall of the bit line contact 146, a sidewall of the wire conductive film 140, and a sidewall of the wire capping film 144. The wire spacer 150 may be extended in the third direction DR3 on the sidewall of the bit line contact 146, the sidewall of the wire conductive film 140, and the sidewall of the wire capping film 144.

The wire spacer 150 may be a single-layered film, or as illustrated in FIG. 2, the wire spacer 150 may be a multi-layered film including a first spacer 151 and a second spacer 152. For example, the first and second spacers 151, 152 may include one of a silicon oxide film, a silicon nitride film, a silicon oxynitride film (SiON), a silicon oxycarbonitride film (SiOCN), air, and a combination thereof. However, the present disclosure is not limited thereto.

A first interlayer insulation film 170 may be arranged on the oxide semiconductor layer 102 and the isolation film 105. The first interlayer insulation film 170 may be arranged to overlap the gate structure 110 formed in the oxide semiconductor layer 102 and the isolation film 105.

The first interlayer insulation film 170 may be arranged on the gate structure 110 and may be elongated in the second direction DR2. The first interlayer insulation film 170 may intersect with the bit line structure 145 extended in the third direction DR3. A space between the adjacent first interlayer insulation films 170 may overlap the oxide semiconductor layer 102 and the isolation film 105 in the fourth direction DR4.

The first interlayer insulation film 170 may include at least one of, for example, silicon oxide, silicon nitride, silicon oxynitride, and a combination thereof. It is illustrated that the first interlayer insulation film 170 is a single-layered film, but this is only for convenience of explanation, and the present disclosure is not limited thereto.

The storage contact 120 may be arranged between the adjacent gate structures 110 and between the adjacent wire conductive films 140. A portion of the storage contact 120 may be arranged to be extended to the insides of the oxide semiconductor layer 102 and the isolation film 105.

The storage contact 120 may be arranged between the adjacent gate structures 110 and between the adjacent wire conductive films 140. The storage contact 120 may overlap the oxide semiconductor layer 102 and the isolation film 105 between the adjacent gate structures 110 and between the adjacent wire conductive films 140. The gate structure 110 may be positioned between the storage contact 120 and the bit line contact 146. Herein, the storage contact 120 may correspond to the buried contact BC.

An upper surface of the storage contact 120 may be closer to the substrate 100 than an upper surface of the first interlayer insulation film 170 and an upper surface of the bit line structure 145. However, the present disclosure is not limited thereto.

Although FIG. 2 depicts that a lower surface of the storage contact 120 contacting the oxide semiconductor layer 102 and a lower surface of the storage contact 120 contacting the isolation film 105 do not have a stepped portion, the present disclosure is not limited thereto. That is, in some other example embodiments, a stepped portion may be formed between the lower surface of the storage contact 120 contacting the oxide semiconductor layer 102 and the lower surface of the storage contact 120 contacting the isolation film 105.

The storage contact 120 may include at least one of, for example, a semiconductor material doped with impurity, a conductive silicide compound, conductive metal nitride, and metal.

A storage pad 160 may be arranged on the storage contact 120. The storage pad 160 may be electrically connected with the storage contact 120.

The storage pad 160 may include at least one of, for example, a semiconductor material doped with impurity, a conductive silicide compound, conductive metal nitride, and metal.

A second interlayer insulation film 180 may be arranged on the storage pad 160, the bit line structure 145, and the first interlayer insulation film 170. The second interlayer insulation film 180 may define a region of the storage pad 160 forming a plurality of isolation regions. Further, the second interlayer insulation film 180 may be patterned so as to expose a portion of the upper surface of the storage pad 160.

The second interlayer insulation film 180 may include an insulation material to electrically isolate the plurality of storage pads 160 from one another. For example, the second interlayer insulation film 180 may include one of a silicon oxide film, a silicon nitride film, a silicon oxynitride film, and a combination thereof, but the present disclosure is not limited thereto.

The capacitor 190 may be formed on the second interlayer insulation film 180. The capacitor 190 may be electrically connected with the storage pad 160. That is, the capacitor 190 may be electrically connected with the storage contact 120.

The capacitor 190 may include a lower electrode 191, a capacitor insulation film 192, and/or an upper electrode 193.

The lower electrode 191 may have a pillar shape, for example. For example, the lower electrode 191 may be extended in the fourth direction DR4, which is a thickness direction of the first substrate 101.

The lower electrode 191 may include, for example, a doped semiconductor material, conductive metal nitride (e.g., titanium nitride, tantalum nitride, or tungsten nitride), metal (e.g., ruthenium, iridium, titanium or tantalum), conductive metal oxide (e.g., iridium oxide), or the like, but the present disclosure is not limited thereto.

The capacitor insulation film 192 may be arranged on the lower electrode 191. The capacitor insulation film 192 may be arranged along a profile of the lower electrode 191. That is, the capacitor insulation film 192 may be formed along a sidewall and an upper surface of the lower electrode 191.

For example, the capacitor insulation film 192 may include one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

The upper electrode 193 may be arranged on the capacitor insulation film 192. The upper electrode 193 may surround the lower electrode 191.

The upper electrode 193 may include at least one of, for example, a doped semiconductor material, metal, conductive metal nitride, and metal silicide.

The semiconductor device according to some example embodiments has the oxide semiconductor layer, including a material that does not include silicon and has a higher bandgap, formed on a channel region of the active region ACT, thereby enhancing leakage characteristics and thus improving reliability.

Hereinafter, a method for fabricating a semiconductor device according to some example embodiments will be described with reference to FIG. 1 to FIG. 12.

FIG. 3 to FIG. 12 are views illustrating intermediate stages of fabrication, provided to explain a method for fabricating a semiconductor device according to some example embodiments.

Figure 3:
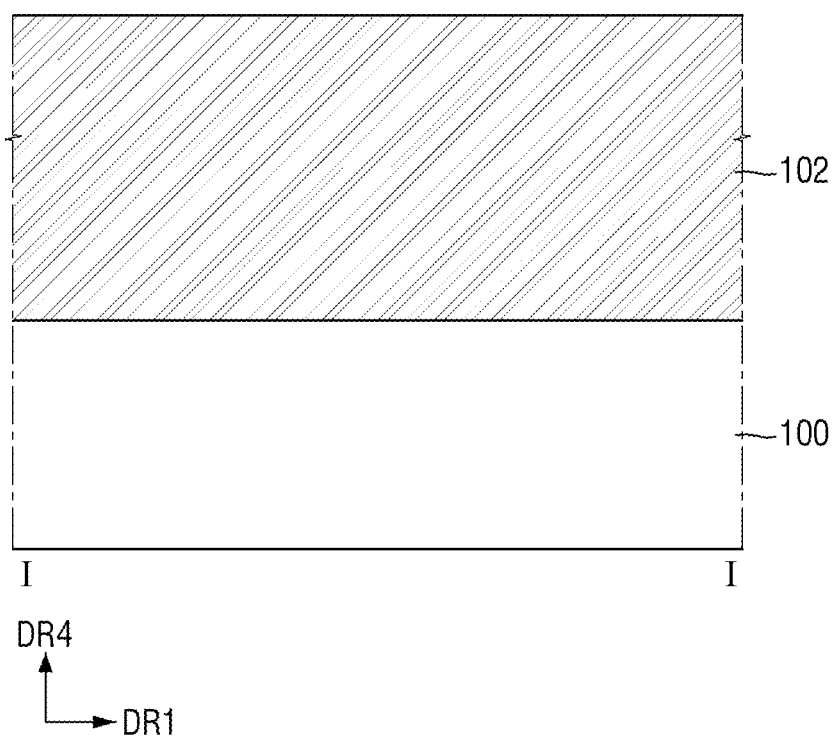
FIG. 3 to FIG. 12 are views illustrating intermediate stages of fabrication, provided to explain a method for fabricating a semiconductor device according to some example embodiments of the present disclosure.

Referring to FIG. 3, an oxide semiconductor layer 102 may be formed on a substrate 100.

The substrate 100 may be, for example, a silicon substrate. The oxide semiconductor layer 102 may include a material that does not include silicon and has a higher bandgap, for example, indium gallium zinc oxide (IGZO).

Figure 4:
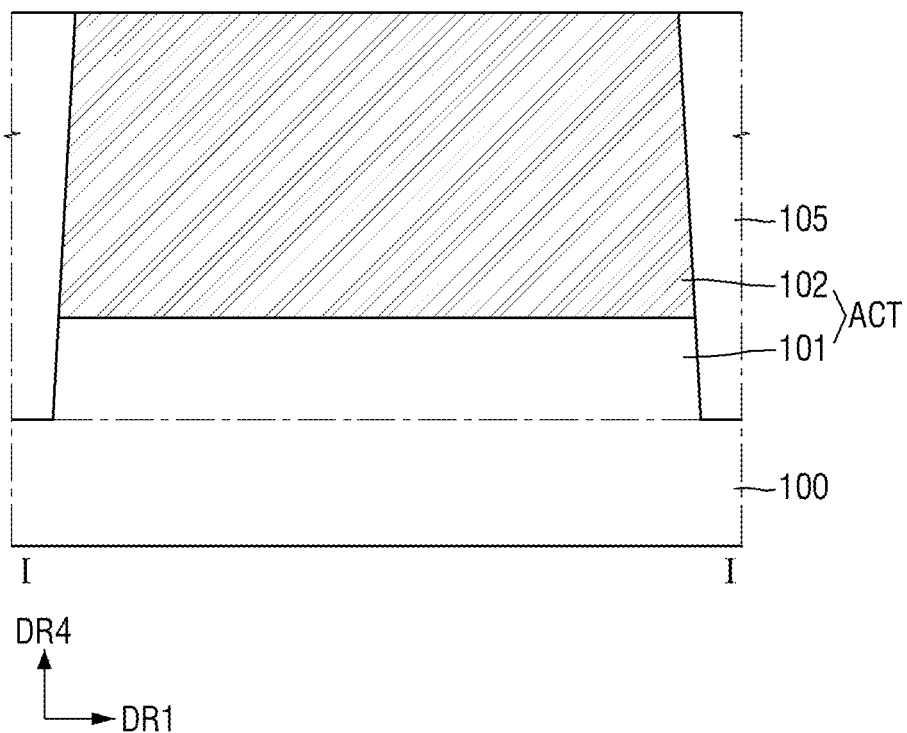

Referring to FIG. 4, an isolation film 105 may be formed by filling an insulation material inside a trench which is formed by etching a portion of the substrate 100 and the oxide semiconductor layer 102.

A first substrate 101 and the oxide semiconductor layer 102 may be included on the substrate 100 by the isolation film 105, and an active region ACT extended in the first direction DR1 may be defined.

Figure 5:
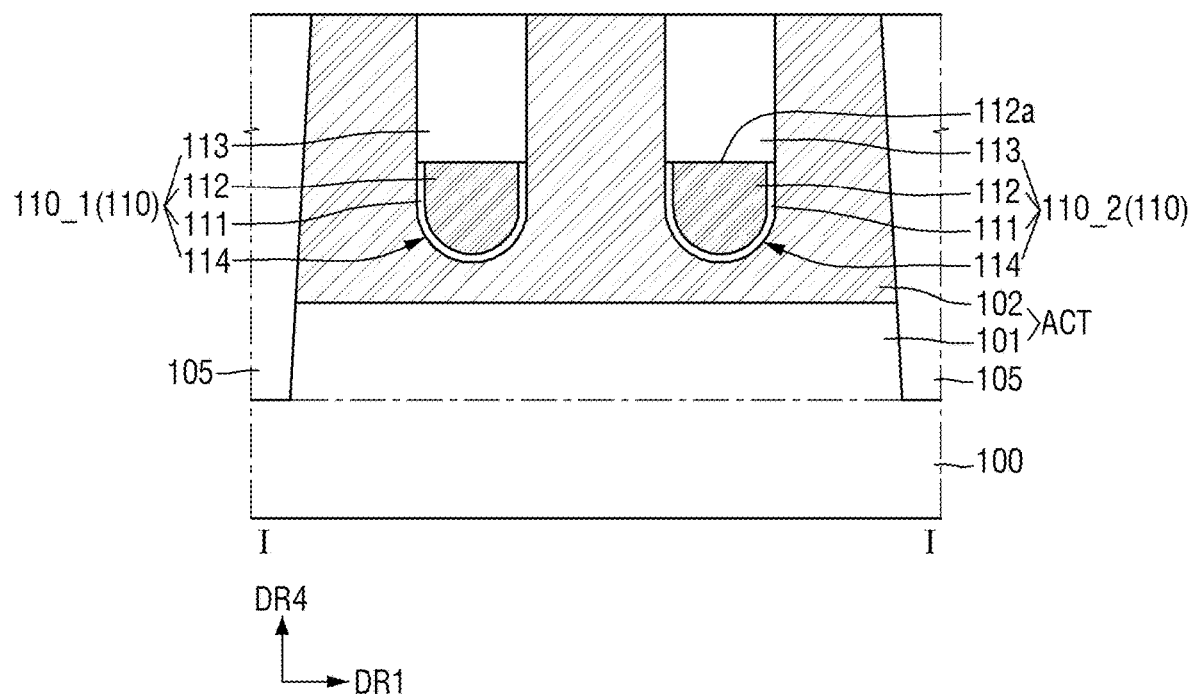

Referring to FIG. 1 and FIG. 5, a plurality of gate structures 110 extended in the second direction DR2 may be formed in the oxide semiconductor layer 102 and the isolation film 105.

The plurality of gate structures 110 may be spaced apart from one another, respectively, in the third direction DR3 (FIG. 1). FIG. 5 depicts that a first gate structure 110_1 and a second gate structure 110_2 are spaced apart from each other in the first direction DR1 inside the oxide semiconductor layer 102.

For example, a recess 114 extended in the second direction DR2 may be formed in the oxide semiconductor layer 102 and the isolation film 105. Because etching rates of the oxide semiconductor layer 102 and the isolation film 105 may be different, a depth of the recess 114 in the oxide semiconductor layer 102 may be different from a depth of the recess 114 in the isolation film 105.

A gate insulation film 111 may be formed along a sidewall and a bottom surface of the recess 114. The gate insulation film 111 may be extended along an upper surface of the oxide semiconductor layer 102 and an upper surface of the isolation film 105, but the present disclosure is not limited thereto.

A gate conductive film for filling the recess 114 may be formed on the gate insulation film 111. The gate conductive film may also be formed on the upper surface of the oxide semiconductor layer 102 and the upper surface of the isolation film 105.

Then, by removing a portion of the gate conductive film filling the recess 114, a gate electrode 112 for filling a portion of the recess 114 may be formed. The gate conductive film on the upper surface of the oxide semiconductor layer 102 and the upper surface of the isolation film 105 may also be removed.

Further, the gate insulation film 111 extended along the upper surface of the oxide semiconductor layer 102 and the upper surface of the isolation film 105, and a portion of the gate insulation film 111 formed on a sidewall of the recess 114 may also be removed.

Then, a capping film 113 filling a portion of the recess 114 may be formed on the gate electrode 112. In some example embodiments, an upper surface of the capping film 113 may be formed on the same plane as the upper surface of the oxide semiconductor layer 102.

Figure 6:
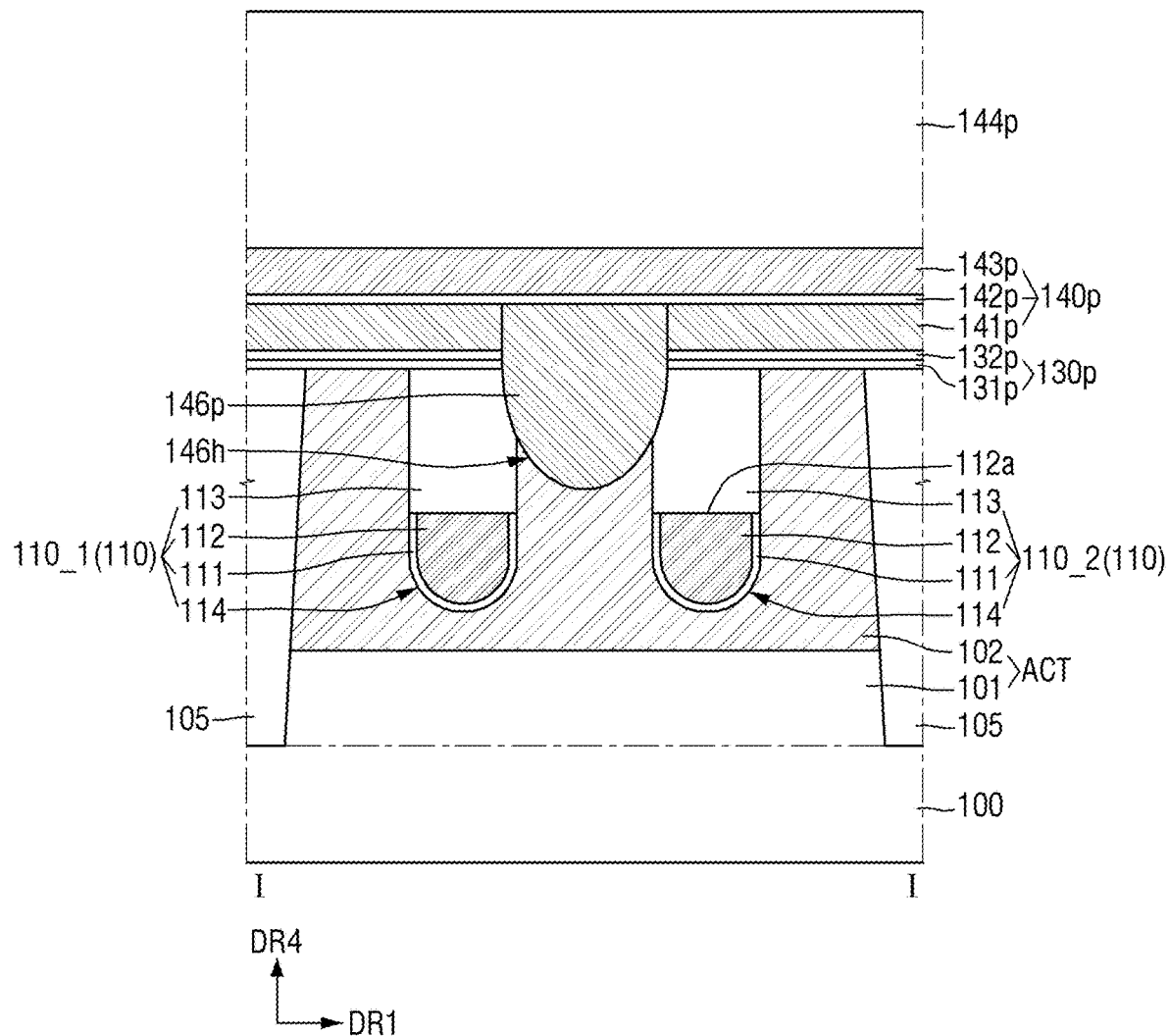

Referring to FIG. 6, on the oxide semiconductor layer 102 having the plurality of gate structures 110 formed therein, a pre-cell insulation film 130p, a pre-wire conductive film 140p including a pre-bit line contact 146p connected with the oxide semiconductor layer 102, and/or a pre-wire capping film 144p may be formed in sequence.

For example, the pre-cell insulation film 130p may be formed on the oxide semiconductor layer 102, the isolation film 105, and the gate structure 110. A first pre-conductive film 141p may be formed on the pre-cell insulation film 130p.

The pre-cell insulation film 130p may include a first pre-cell insulation film 131p and a second pre-cell insulation film 132p, but the present disclosure is not limited thereto.

Then, on a region where a bit line contact 146 is formed, a bit line contact hole 146h may be formed by removing the first pre-conductive film 141p and the pre-cell insulation film 130p. The pre-bit line contact 146p for filling the bit line contact hole 146h may be formed.

A second pre-conductive film 142p and a third pre-conductive film 143p may be formed in sequence on the pre-bit line contact 146p and the first pre-conductive film 141p. As a result, the pre-wire conductive film 140p including the first to third pre-conductive films 141p, 142p, 143p may be formed on the pre-cell insulation film 130p.

Then, the pre-wire capping film 144p may be formed on the pre-wire conductive film 140p.

Figure 7:
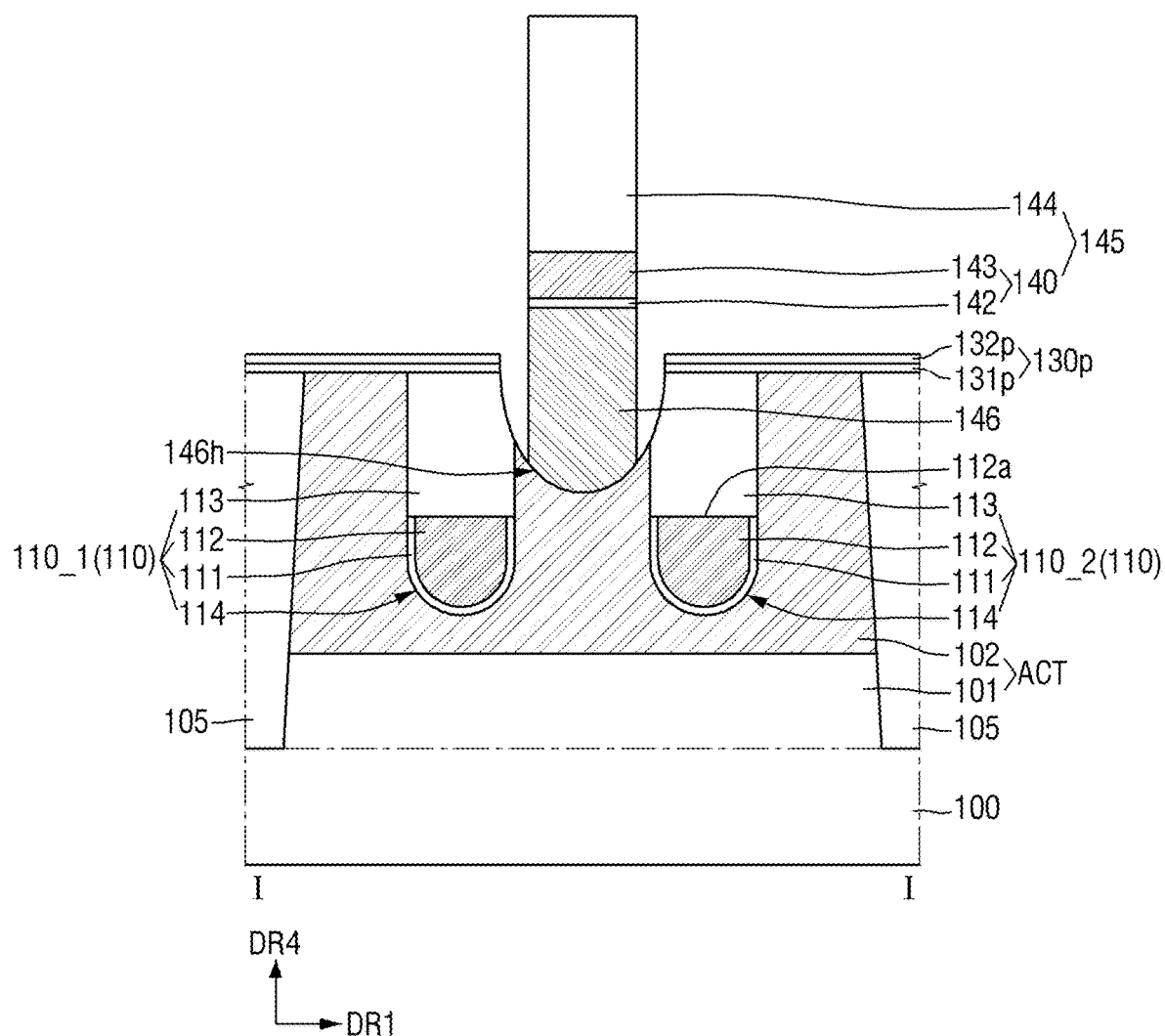

Referring to FIG. 7, a plurality of wire conductive films 140 and/or a wire capping film 144 extended in the third direction DR3 (FIG. 1) may be formed on the oxide semiconductor layer 102 by patterning the pre-wire conductive film 140p and the pre-wire capping film 144p. That is, a bit line structure 145 may be formed on the oxide semiconductor layer 102.

Further, the bit line contact 146 may be formed between the wire conductive film 140 and the oxide semiconductor layer 102 by patterning the pre-bit line contact 146p.

The gate structure 110 formed in the oxide semiconductor layer 102 and the isolation film 105 may be covered by the pre-cell insulation film 130p.

Figure 8:
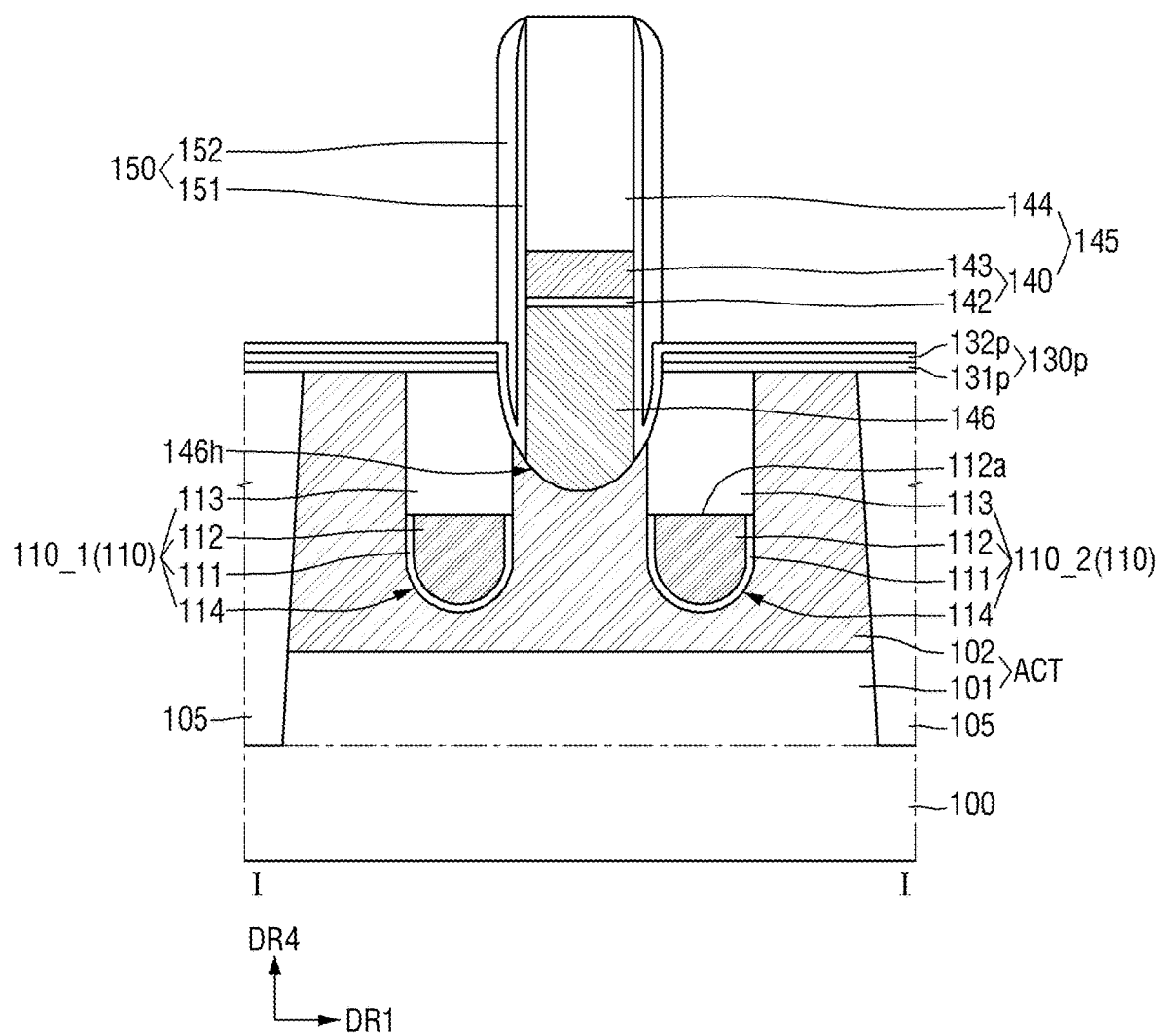

Referring to FIG. 8, a wire spacer 150 may be formed on a sidewall of the bit line structure 145.

For example, the wire spacer 150 may be formed on the oxide semiconductor layer 102 and the isolation film 105 at a portion of the wire conductive film 140 where the bit line contact 146 is formed. The wire spacer 150 may be extended along the sidewall of the bit line structure 145 in the third direction DR3 (FIG. 1).

In addition, the wire spacer 150 may be formed on the pre-cell insulation film 130p at a remaining portion of the bit line structure 145 where the bit line contact 146 is not formed.

The wire spacer 150 may include a first spacer 151 and a second spacer 152, but the present disclosure is not limited thereto. The first spacer 151 of the wire spacer 150 may be formed along an upper surface of the pre-cell insulation film 130p.

Figure 9:
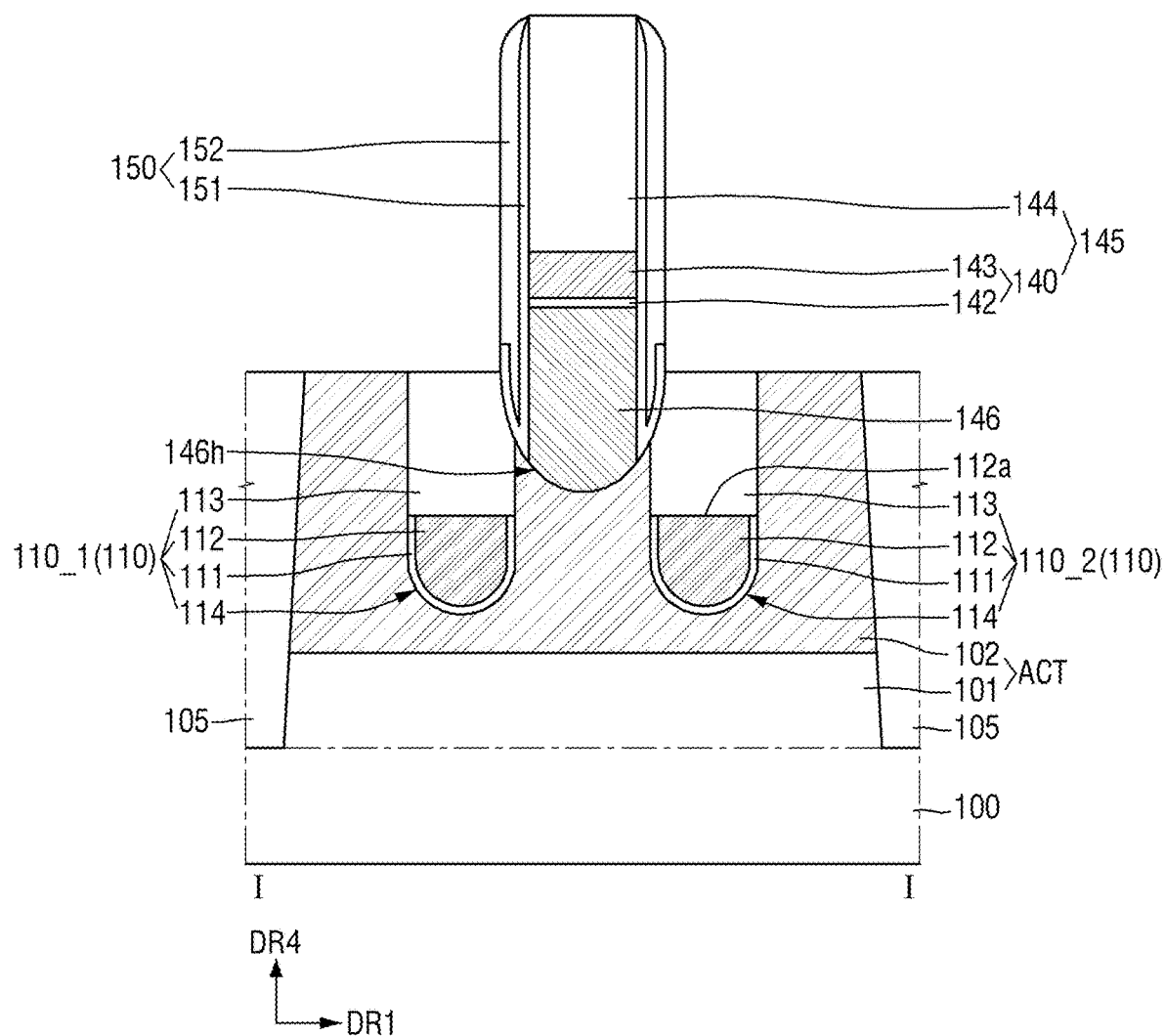

Referring to FIG. 9, in the bit line structure 145 and the wire spacer 150, the pre-cell insulation film 130p that does not overlap the second spacer 152 and the first spacer 151 may be removed.

As a result, the upper surfaces of the oxide semiconductor layer 102 and the isolation film 105 may be exposed. In addition, the upper surface of the gate structure 110 may also be exposed.

Figure 10:
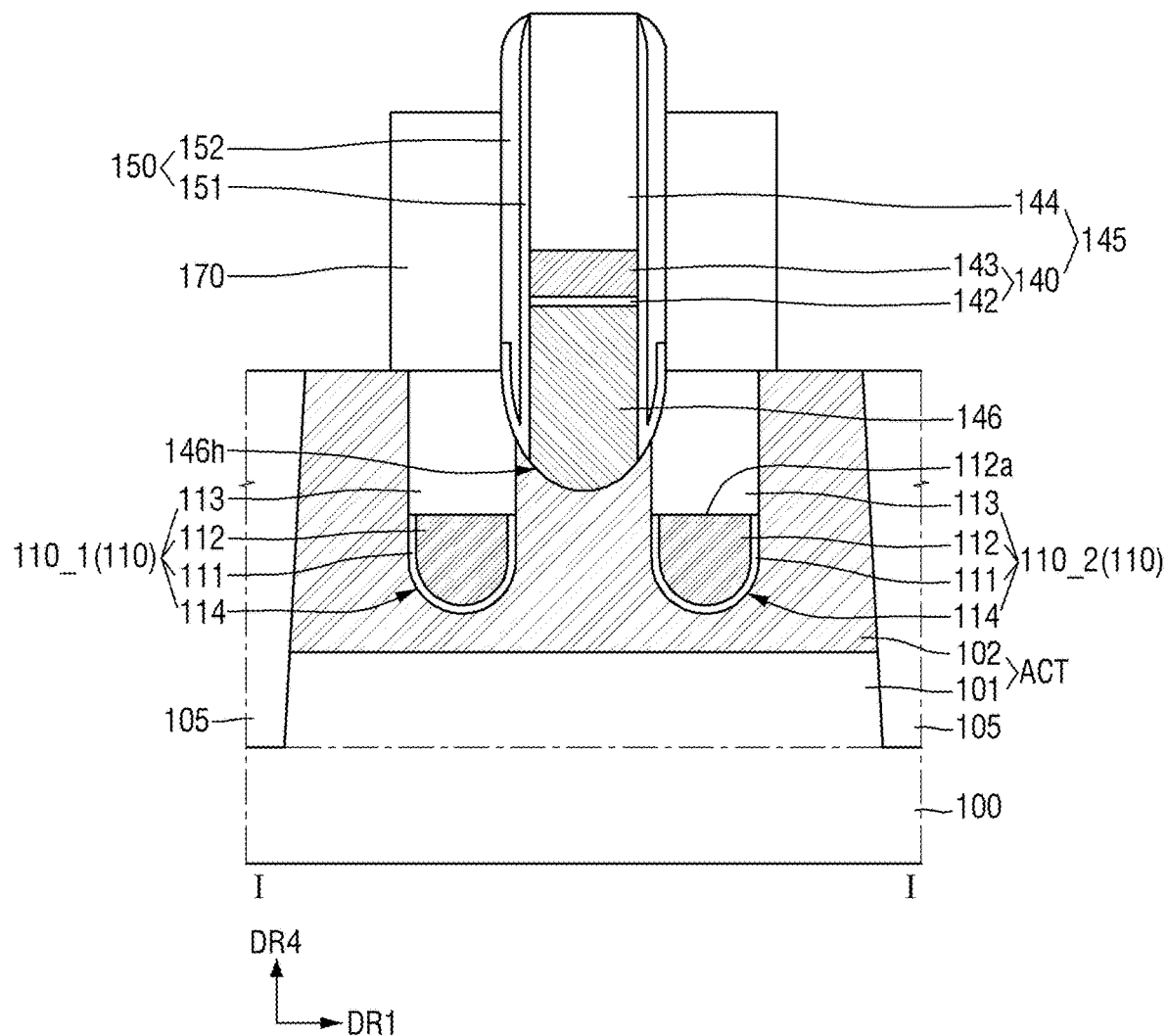

Referring to FIG. 10, a first interlayer insulation film 170 extended in the second direction DR2 (FIG. 1) may be formed on the oxide semiconductor layer 102 and the isolation film 105. The first interlayer insulation film 170 may intersect with the bit line structure 145.

The first interlayer insulation film 170 may be formed to overlap the gate structure 110 formed in the oxide semiconductor layer 102 and the isolation film 105.

As a result, the oxide semiconductor layer 102 and the isolation film 105 which are not covered by the first interlayer insulation film 170 and the bit line structure 145 may be exposed. That is, the oxide semiconductor layer 102 and the isolation film 105 between the adjacent gate structures 110 and between the adjacent wire conductive films 140 may be exposed.

Figure 11:
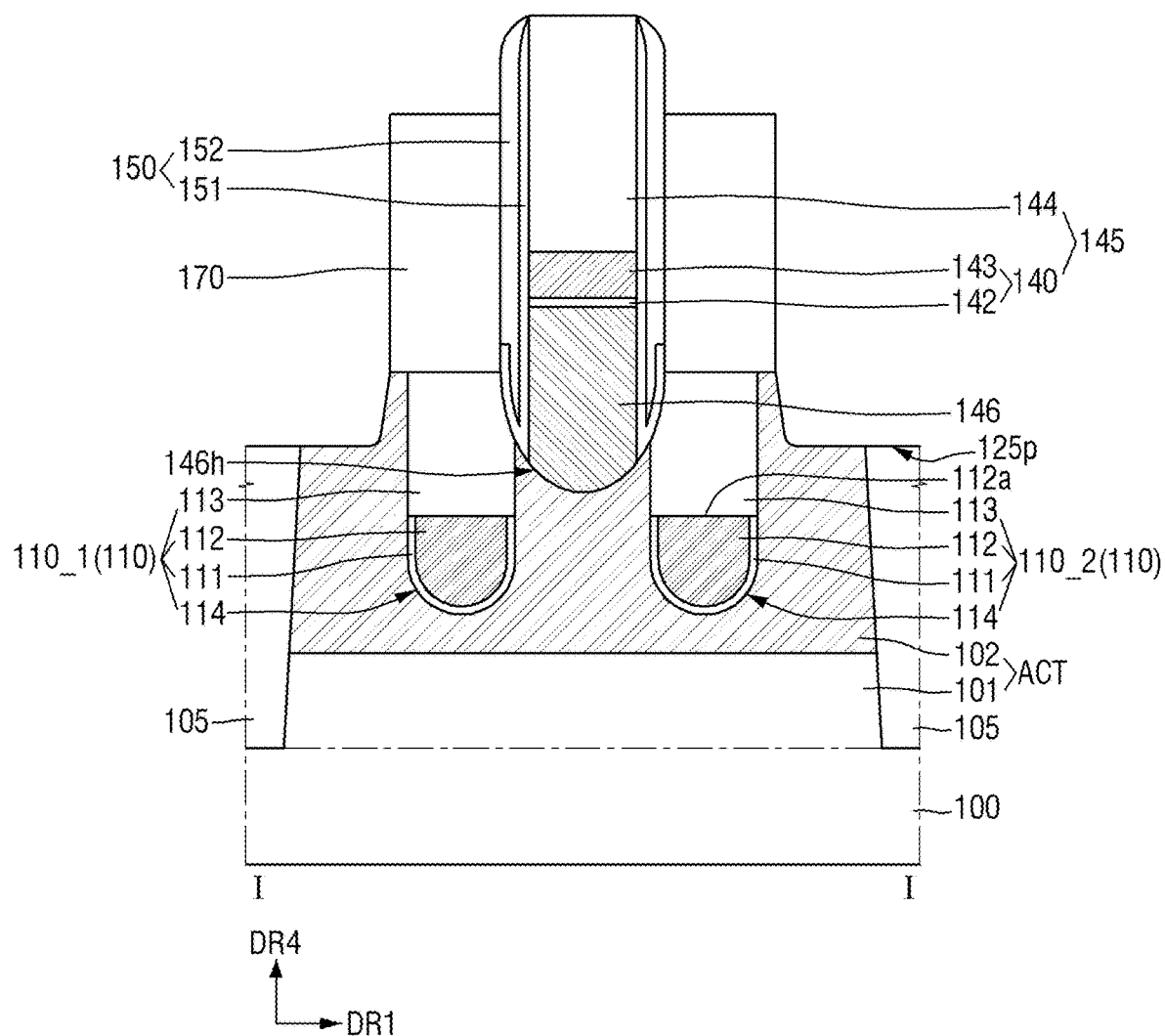

Referring to FIG. 11, a storage contact recess 125p may be formed in the oxide semiconductor layer 102 and the isolation film 105 by removing the oxide semiconductor layer 102 and the isolation film 105 between the adjacent gate structures 110 and between the adjacent wire conductive films 140.

The storage contact recess 125p may be formed by using the first interlayer insulation film 170 extended in the second direction DR2 (FIG. 1), and the bit line structure 145 and the wire spacer 150 which are extended in the third direction DR3 (FIG. 1), as a mask.

Figure 12:
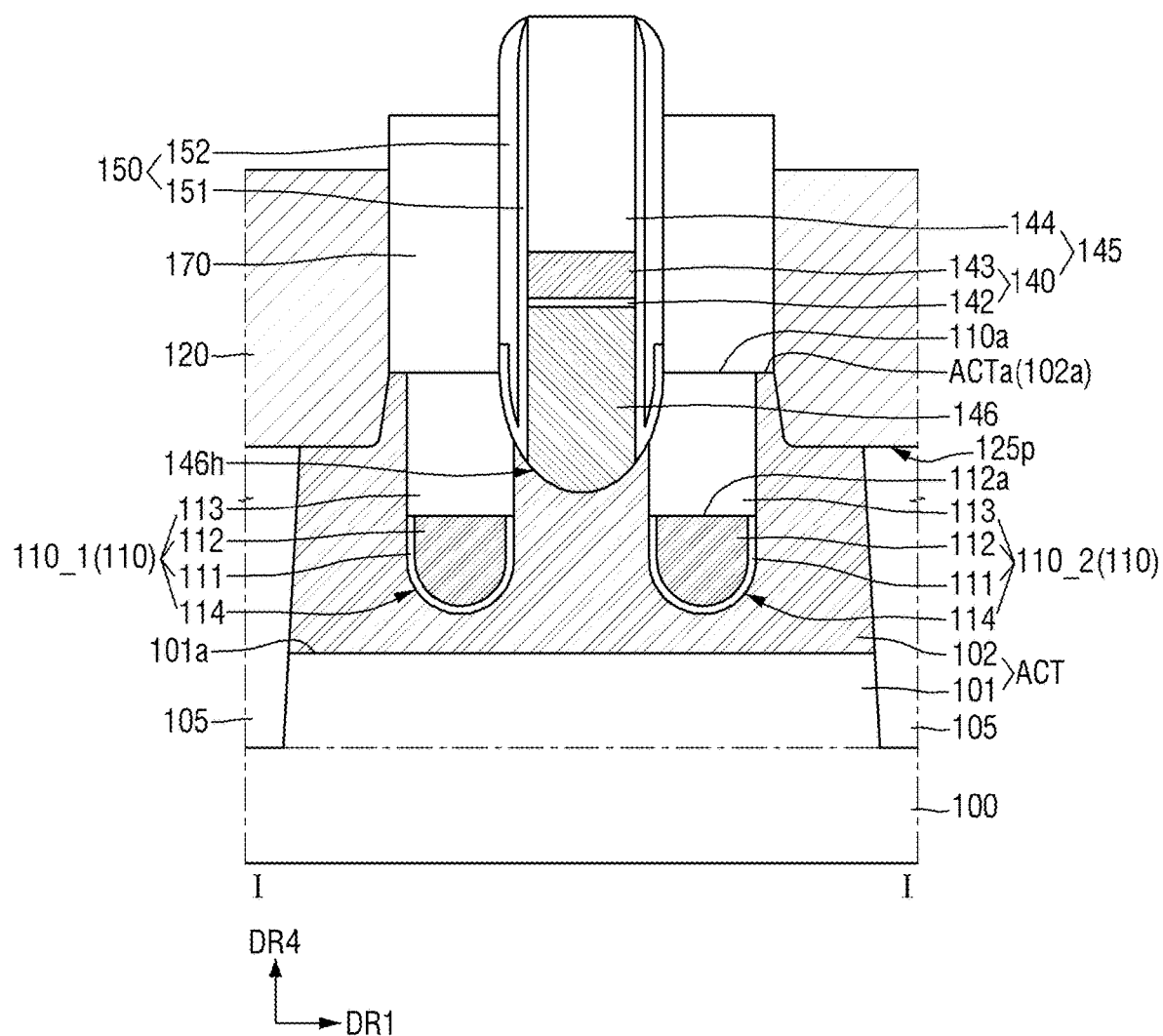

Referring to FIG. 12, a storage contact 120 for filling the storage contact recess 125p may be formed on the oxide semiconductor layer 102 and the isolation film 105 between the adjacent gate structures 110 and between the adjacent wire conductive films 140.

The storage contact 120 may be formed along a portion of the sidewall of the first interlayer insulation film 170.

Referring to FIG. 2, a second interlayer insulation film 180 may be formed on a storage pad 160, the first interlayer insulation film 170, and the bit line structure 145 after the storage pad 160 is formed on the storage contact 120.

Then, a capacitor 190 electrically connected with the storage pad 160 may be formed on the second interlayer insulation film 180. Through the above-described fabrication method, the semiconductor device illustrated in FIG. 2 may be fabricated.

Hereinbelow, a semiconductor device according to some other example embodiments will be described with reference to FIG. 13. The difference from the semiconductor device illustrated in FIG. 2 will be highlighted.

Figure 13:
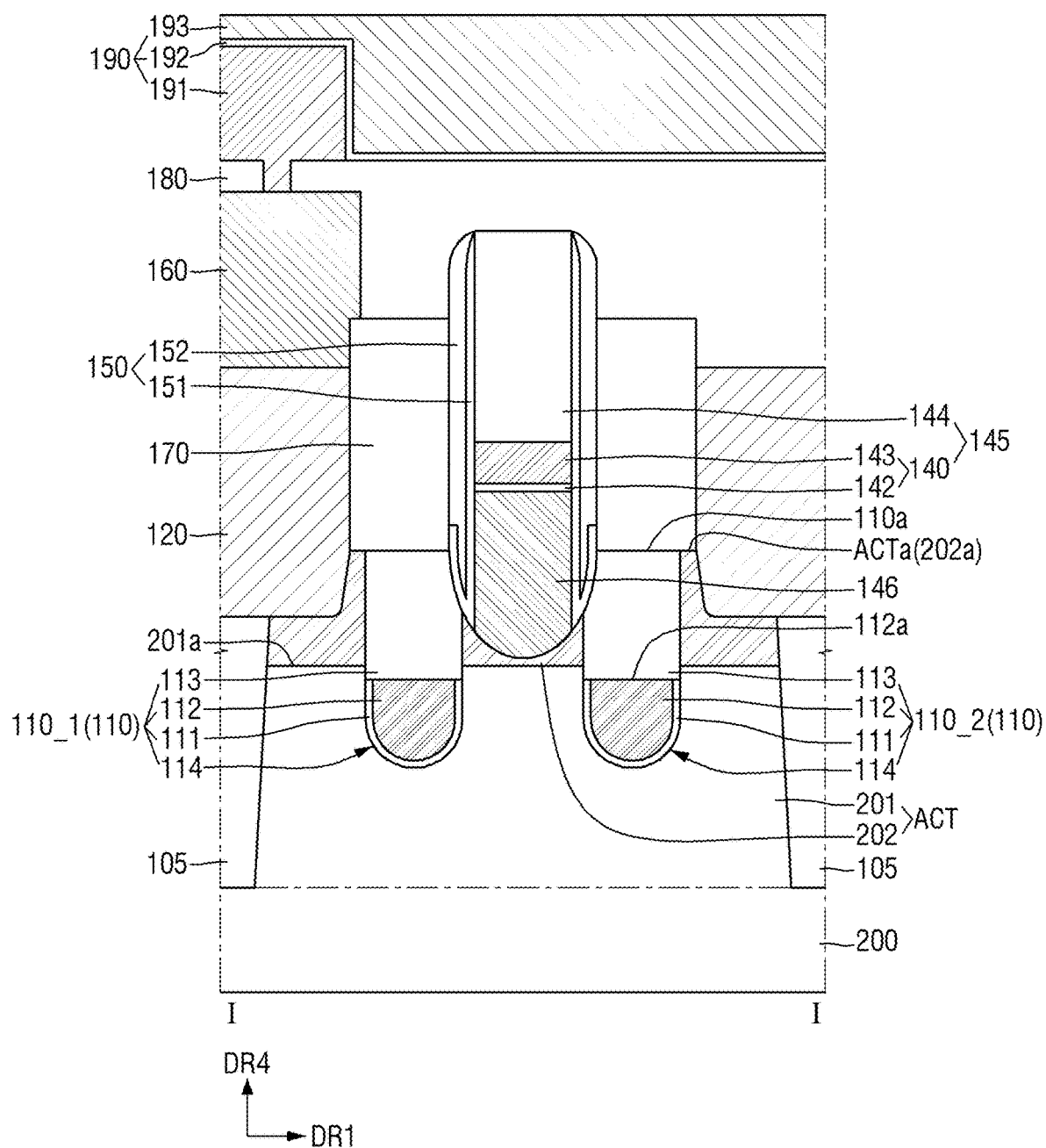
FIG. 13 is a view provided to explain a semiconductor device according to some other example embodiments of the present disclosure.

FIG. 13 is a view provided to explain a semiconductor device according to some other example embodiments.

Referring to FIG. 13, in the semiconductor device according to some other example embodiments, an active region ACT arranged on a substrate 200 includes a first substrate 201 and an oxide semiconductor layer 202 arranged on the first substrate 201.

A recess 114 having a gate structure 110 formed therein may be extended to the inside of the first substrate 201 through the oxide semiconductor layer 202. That is, the gate structure 110 may be arranged inside the first substrate 201 and the oxide semiconductor layer 202.

An upper surface 201a of the first substrate 201 may be formed to be closer to an upper surface 202a of the oxide semiconductor layer 202 than an upper surface 112a of a gate electrode 112. That is, the upper surface 201a of the first substrate 201 may be formed between the upper surface 112a of the gate electrode 112 and the upper surface 202a of the oxide semiconductor layer 202.

In some example embodiments, a lower portion of a bit line structure 145 may be arranged inside the oxide semiconductor layer 202.

Hereinbelow, a semiconductor device according to some other example embodiments will be described with reference to FIG. 14. The difference from the semiconductor device illustrated in FIG. 2 will be highlighted.

Figure 14:
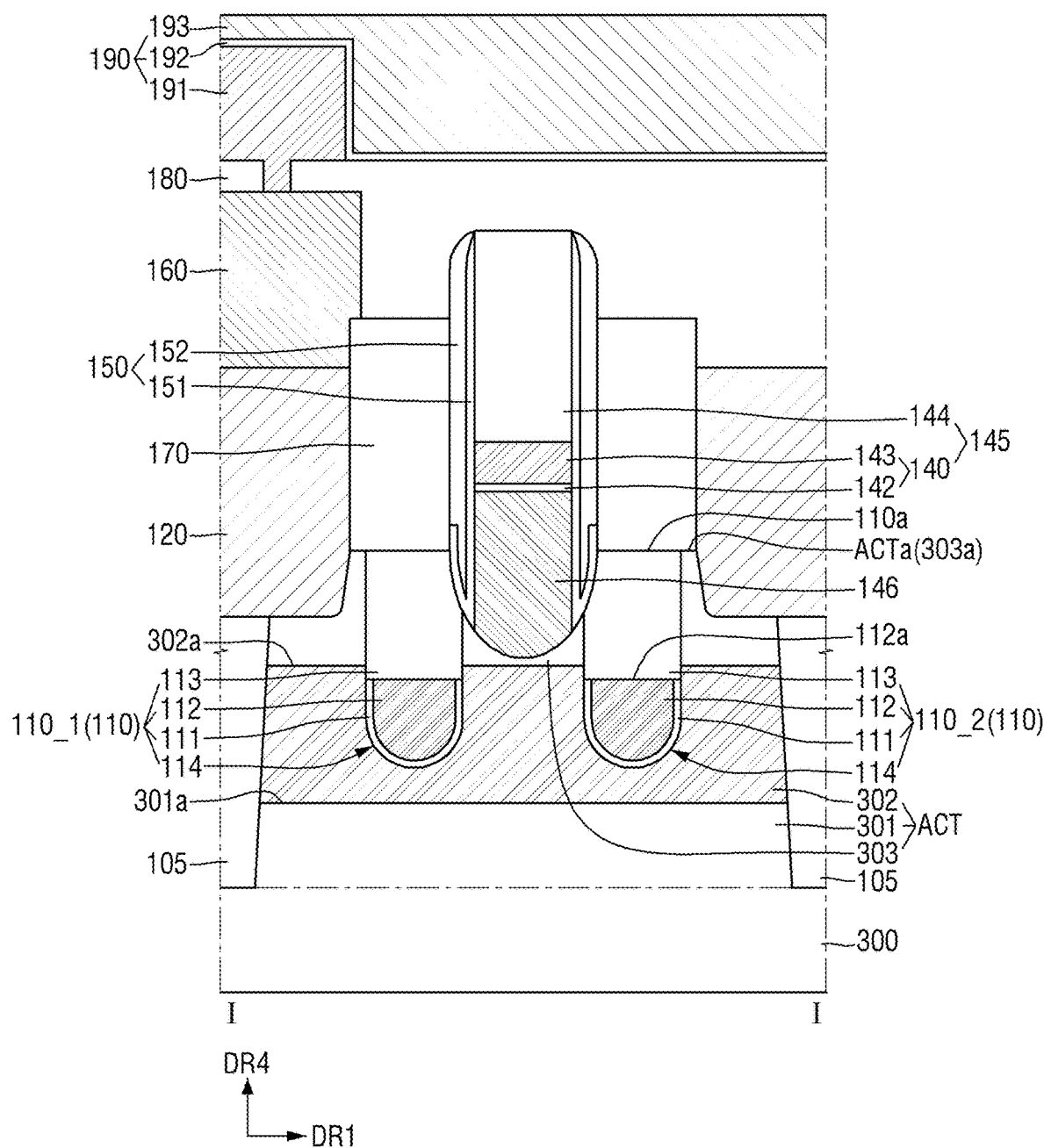
FIG. 14 is a view provided to explain a semiconductor device according to some other example embodiments of the present disclosure.

FIG. 14 is a view provided to explain a semiconductor device according to some other example embodiments.

Referring to FIG. 14, in the semiconductor device according to some other example embodiments, an active region ACT arranged on a substrate 300 includes a first substrate 301, an oxide semiconductor layer 302 arranged on the first substrate 301, and/or a second substrate 303 arranged on the oxide semiconductor layer 302.

The second substrate 303 may be arranged on the uppermost portion of the active region ACT. That is, an upper surface 303a of the second substrate 303 may be formed on the same plane as an upper surface ACTa of the active region ACT and an upper surface 110a of a gate structure 110.

A recess 114 having the gate structure 110 formed therein may be extended to the inside of the oxide semiconductor layer 202 through the second substrate 303. That is, the gate structure 110 may be arranged inside the oxide semiconductor layer 302 and the second substrate 303.

An upper surface 302a of the oxide semiconductor layer 302 may be formed to be closer to the upper surface 303a of the second substrate 303 than an upper surface 112a of a gate electrode 112. That is, the upper surface 302a of the oxide semiconductor layer 302 may be formed between the upper surface 112a of the gate electrode 112 and the upper surface 303a of the second substrate 303.

In some example embodiments, a lower portion of a bit line structure 145 may be arranged inside the second substrate 303.

Hereinbelow, a semiconductor device according to some other example embodiments will be described with reference to FIG. 15. The difference from the semiconductor device illustrated in FIG. 2 will be highlighted.

Figure 15:
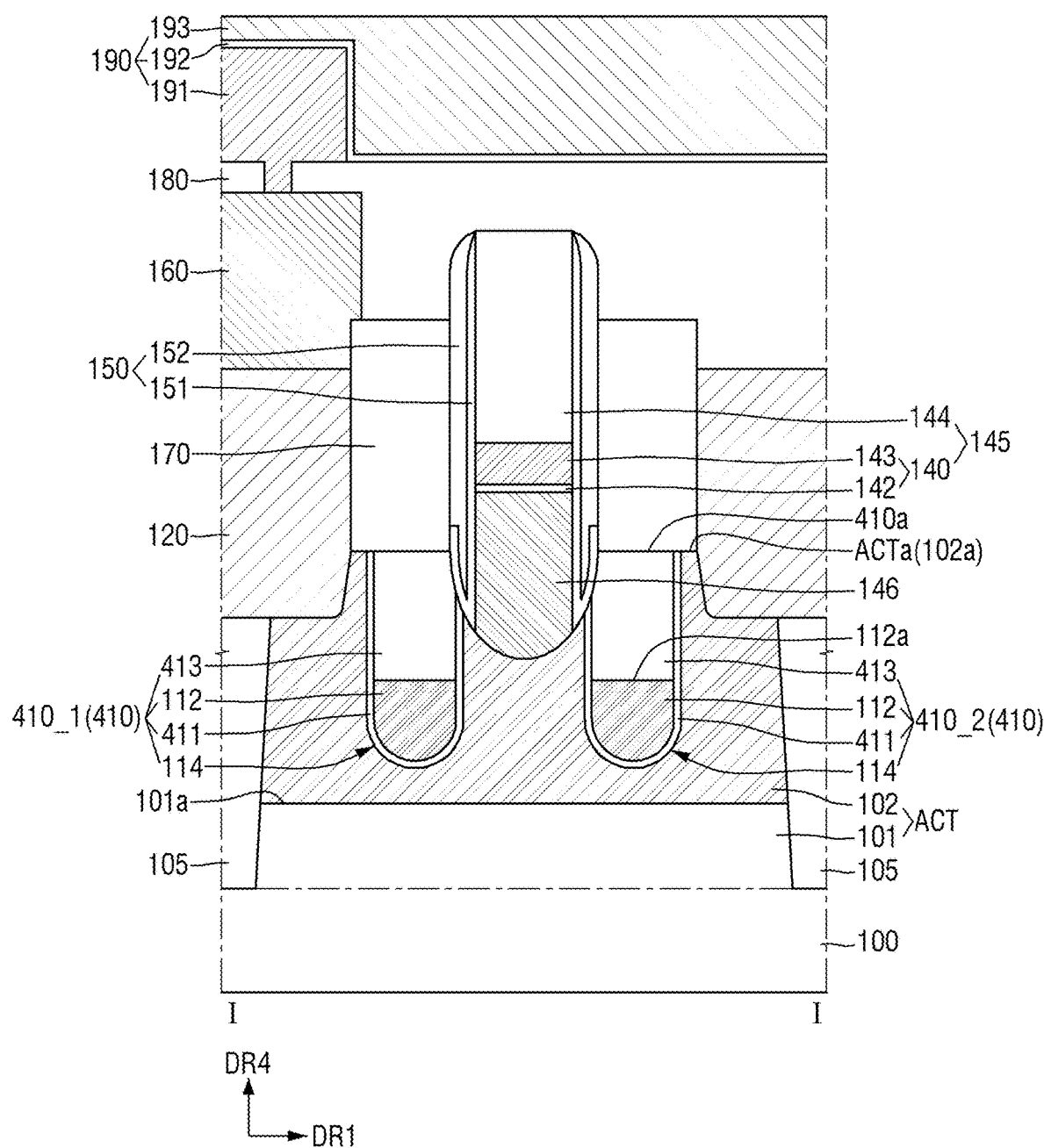
FIG. 15 is a view provided to explain a semiconductor device according to some other example embodiments of the present disclosure.

FIG. 15 is a view provided to explain a semiconductor device according to some other example embodiments.

Referring to FIG. 15, in the semiconductor device according to some other example embodiments, a plurality of gate structures 410 may include a recess 114, a gate insulation film 411, a gate electrode 112, and/or a capping film 413, which are formed in an oxide semiconductor layer 102 and an isolation film 105.

The two gate structures 410 may be arranged on one active region ACT across the active region ACT. The two gate structures 410 may be spaced apart from each other in the third direction DR3 (FIG. 1). This is illustrated in FIG. 15 as a first gate structure 410_1 and a second gate structure 410_2 being spaced apart from each other in the active region ACT in the first direction DR1.

The gate insulation film 411 may be extended to an upper surface 410a of the gate structure 410 along a sidewall and a bottom surface of the recess 114. The capping film 413 may fill the recess 114 on the gate insulation film 411 and the gate electrode 112.

Hereinbelow, a semiconductor device according to some other example embodiments will be described with reference to FIG. 16. The difference from the semiconductor device illustrated in FIG. 2 will be highlighted.

Figure 16:
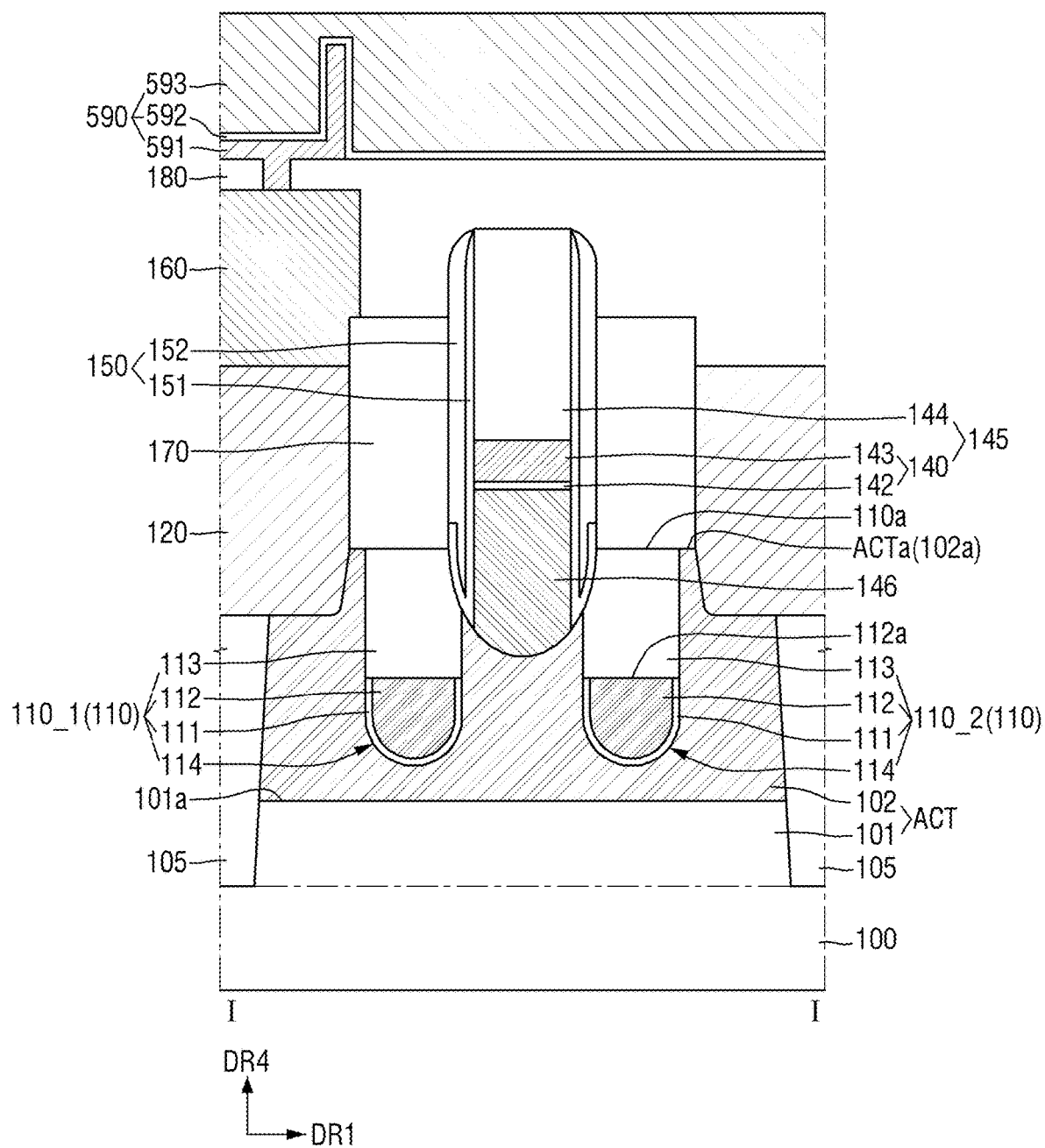
FIG. 16 is a view provided to explain a semiconductor device according to some other example embodiments of the present disclosure.

FIG. 16 is a view provided to explain a semiconductor device according to some other example embodiments.

Referring to FIG. 16, the semiconductor device according to some other example embodiments may have a capacitor 590 formed in a cylindrical shape.

For example, a lower electrode 591 of the capacitor 590 may include a sidewall extended in the fourth direction (DR4) of a substrate 100, and a bottom portion which is parallel to an upper surface 101a of a first substrate 101. The bottom portion of the lower electrode 591 may connect the sidewalls of the lower electrode 591.

A capacitor insulation film 592 may be arranged on the lower electrode 591. The capacitor insulation film 592 may be arranged along a profile of the lower electrode 591. The capacitor insulation film 592 may be arranged along an outer sidewall and an inner sidewall of the lower electrode 591.

An upper electrode 593 may be arranged on the capacitor insulation film 592. The upper electrode 593 may surround the outer sidewall of the lower electrode 591. In addition, a portion of the upper electrode 593 may be arranged between the sidewalls of the lower electrode 591.

Exemplary embodiments according to the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concept or essential characteristics of the present disclosure. Accordingly, it will be understood that the example embodiments described above are only illustrative, and should not be construed as limiting.

What is claimed is:

1. A semiconductor device comprising:
a first substrate;
an active region defined by an isolation film in the first substrate;
an oxide semiconductor layer on the first substrate in the active region, and not comprising silicon, the oxide semiconductor layer including a recess, the first substrate including a first material and the oxide semiconductor layer including a second material, the first material and the second material being different; and
a gate structure filling the recess, comprising a gate electrode and a capping film on the gate electrode, the gate structure having an upper surface on a same plane as an upper surface of the active region, the active region including a portion of the substrate defined by the isolation film and the oxide semiconductor layer.

2. The semiconductor device of claim 1, wherein an upper surface of the oxide semiconductor layer is on a same plane as the upper surface of the gate structure.

3. The semiconductor device of claim 1, wherein an upper surface of the gate electrode is between an upper surface of the first substrate and an upper surface of the oxide semiconductor layer.

4. The semiconductor device of claim 1, wherein an upper surface of the first substrate is between an upper surface of the gate electrode and an upper surface of the oxide semiconductor layer.

5. The semiconductor device of claim 1, wherein the recess extends to an inside of the first substrate through the oxide semiconductor layer.

6. The semiconductor device of claim 1, further comprising a second substrate on the oxide semiconductor layer,
wherein the recess extends to an inside of the oxide semiconductor layer through the second substrate.

7. The semiconductor device of claim 6, wherein an upper surface of the second substrate is on a same plane as the upper surface of the gate structure.

8. The semiconductor device of claim 1, wherein the gate structure further comprises a gate insulation film between an inner wall of the recess and the gate electrode along the inner wall of the recess.

9. The semiconductor device of claim 8, wherein the gate insulation film is between the inner wall of the recess and the capping film along the inner wall of the recess.

10. The semiconductor device of claim 1, wherein the oxide semiconductor layer comprises indium gallium zinc oxide.

11. A semiconductor device comprising:
a substrate;
an active region defined by an isolation film in the substrate;
a gate structure in the isolation film and the active region, and having an upper surface on a same plane as an upper surface of the active region;
an oxide semiconductor layer in the active region, contacting at least a part of a sidewall of the gate structure, and not comprising silicon, the active region including a portion of the substrate defined by the isolation film and the oxide semiconductor layer, the substrate including a first material and the oxide semiconductor layer including a second material, the first material and the second material being different; and
a capacitor electrically connected with the active region and extended in a thickness direction of the substrate.

12. The semiconductor device of claim 11, wherein the gate structure in the active region is inside the oxide semiconductor layer.

13. The semiconductor device of claim 11, wherein the gate structure in the active region is inside the substrate and the oxide semiconductor layer.

14. The semiconductor device of claim 11, wherein the substrate comprises a first substrate and a second substrate on an upper surface of the first substrate, and
wherein the oxide semiconductor layer is between the first substrate and the second substrate.

15. The semiconductor device of claim 11, wherein the capacitor comprises a lower electrode, a capacitor insulation film on the lower electrode, and an upper electrode on the capacitor insulation film, and
wherein the lower electrode has a pillar shape.

16. The semiconductor device of claim 11, wherein the capacitor comprises a lower electrode, a capacitor insulation film on the lower electrode, and an upper electrode on the capacitor insulation film, and
wherein the lower electrode has a cylindrical shape.

17. A semiconductor device comprising:
a substrate;
an active region defined by an isolation film in the substrate, and extended in a first direction;

an oxide semiconductor layer on the substrate in the active region, extended in the first direction, and not comprising silicon, the substrate including a first material and the oxide semiconductor layer including a second material, the first material and the second material being different;

a word line extended in a second direction which is different from the first direction in the isolation film and the active region; and a bit line extended in a third direction which is different from the first and second directions on the isolation film and the active region, wherein an upper surface of the oxide semiconductor layer is on a same plane as an upper surface of the active region, the active region including a portion of the substrate defined by the isolation film and the oxide semiconductor layer.

18. The semiconductor device of claim 17, further comprising a capping film on an upper surface of the word line, wherein an upper surface of the capping film is on a same plane as the upper surface of the active region.

19. The semiconductor device of claim 17, wherein an upper surface of the word line is between an upper surface of the substrate and the upper surface of the oxide semiconductor layer.

20. The semiconductor device of claim 17, wherein the oxide semiconductor layer comprises indium gallium zinc oxide.

* * * * *